(12) United States Patent
Gradinger et al.

(10) Patent No.: US 11,848,252 B2
(45) Date of Patent: Dec. 19, 2023

(54) SEMICONDUCTOR COMPONENT, MOTOR VEHICLE, AND METHOD FOR PRODUCING A SEMICONDUCTOR COMPONENT

(71) Applicants: AUDI AG, Ingolstadt (DE); Hitachi Energy Switzerland AG, Baden (CH)

(72) Inventors: Thomas Gradinger, Aarau Rohr (CH); Daniele Torresin, Birmenstorf (CH)

(73) Assignees: AUDI AG, Ingolstadt (DE); HITACHI ENERGY SWITZERLAND AG, Baden (CH)

( * ) Notice: Subject to any disclaimer, the term of this patent is extended or adjusted under 35 U.S.C. 154(b) by 166 days.

(21) Appl. No.: 16/846,844

(22) Filed: Apr. 13, 2020

(65) Prior Publication Data
US 2020/0350232 A1    Nov. 5, 2020

(30) Foreign Application Priority Data
May 2, 2019    (DE) .......................... 102019206262.8

(51) Int. Cl.
*H01L 23/473*    (2006.01)
*H01L 21/48*    (2006.01)
*H01L 25/07*    (2006.01)

(52) U.S. Cl.
CPC ........ *H01L 23/473* (2013.01); *H01L 21/4882* (2013.01); *H01L 25/072* (2013.01)

(58) Field of Classification Search
CPC ............. H01L 21/4825; H01L 21/4882; H01L 23/473; H01L 23/49548; H01L 23/49827; H01L 23/498838; H01L 25/072; H01L 25/16
See application file for complete search history.

(56) References Cited

U.S. PATENT DOCUMENTS

| | | | |
|---|---|---|---|
| 5,517,059 A | 5/1996 | Eytcheson et al. | |
| 7,943,883 B2 | 5/2011 | Doira et al. | |
| 2003/0053298 A1 | 3/2003 | Yamada et al. | |
| 2004/0183188 A1* | 9/2004 | Oohama | H01L 23/42 257/E23.044 |
| 2009/0194862 A1 | 8/2009 | Kitami | |
| 2011/0012252 A1* | 1/2011 | Gao | H01L 25/071 257/698 |
| 2012/0235293 A1* | 9/2012 | Jones | H01L 23/473 257/E23.098 |
| 2012/0305281 A1 | 12/2012 | Knoll | |
| 2012/0319253 A1 | 12/2012 | Mizuno | |
| 2013/0134572 A1* | 5/2013 | Lenniger | H01L 23/367 438/122 |

(Continued)

FOREIGN PATENT DOCUMENTS

DE    102016110043 A1    12/2016
JP    2005116578 A    *    4/2005
(Continued)

OTHER PUBLICATIONS

JP 2008159946 A, Machine Translation (Year: 2008).*
(Continued)

*Primary Examiner* — Andres Munoz
(74) *Attorney, Agent, or Firm* — Maier & Maier, PLLC

(57) ABSTRACT

A semiconductor component, including a support frame and at least one semiconductor module attached to the support frame, wherein the support frame includes a respective passage (on the edge of which a base plate of the semiconductor module rests, wherein the base plate is soldered to the support frame.

5 Claims, 2 Drawing Sheets

(56) References Cited

U.S. PATENT DOCUMENTS

2016/0183409 A1 6/2016 Zhou et al.
2019/0393132 A1 12/2019 Tamura
2020/0051892 A1* 2/2020 Gohara .............. H01L 23/043

FOREIGN PATENT DOCUMENTS

| JP | 2006-222461 A | 8/2006 |
|----|---------------|--------|
| JP | 2008-159946 A | 7/2008 |
| JP | 2010165743 A | 7/2010 |
| WO | 2017/069005 A1 | 4/2017 |
| WO | 2018/123387 A1 | 7/2018 |

OTHER PUBLICATIONS

Nakada et al., JP-2005116578-A, Machine Translation. (Year: 2005).*
European Search Report dated Jul. 30, 2020, in corresponding European application No. 20168143.4, including partial machine-generated English language translation, 13 pages.
German Examination Report dated Jan. 29, 2020 in corresponding German Application No. 102019206262.8; 20 pages; Machine translation attached.
Ionix, "Laser Brazing", http://www.ionix.fi/en/technologies/laser-processing/laser-brazing, 3 pages.
Coherent, "Laser Brazing", https://www.rofin.com/en/applications/laser-soldering-and-brazing/laser-brazing, 1 page.
Industrial Laser Solutions, "Laser brazing in the auto industry", https://www.industrial-lasers.com/articles/2005/01/laser-brazing-in-the-auto-industry.html, 10 pages.
European Search Report dated Feb. 11, 2022, in connection with corresponding European Application No. 20168143.4 (14 pp., including machine-generated English translation).
German Examination Report dated Jun. 10, 2022, in connection with corresponding German Application No. 102019206262.8 (10 pp., including machine-generated English translation).
Office Action dated Jul. 7, 2023, in corresponding Chinese Application No. 202010354563.6, 14 pages.

* cited by examiner

SEMICONDUCTOR COMPONENT, MOTOR VEHICLE, AND METHOD FOR PRODUCING A SEMICONDUCTOR COMPONENT

FIELD

The disclosure relates to a semiconductor component including a support frame and at least one semiconductor module attached to the support frame. In addition, the invention relates to a method for producing a semiconductor component and a motor vehicle.

BACKGROUND

To drive a three-phase electric machine with the aid of direct current and/or to provide direct current with the aid of a three-phase generator, three-phase inverters and/or rectifiers can be used, which are formed by semiconductor switches. It is possible in this case to form the entire bridge circuit as an encapsulated component, which can subsequently be installed, for example, on a heat sink or the like. The construction of the entire bridge circuit as a single module, however, represents a relatively large economic risk if the individual semiconductor components are to be connected to a substrate by sintering, since the individual components cannot be separately bonded and tested in this case. The pressure occurring during the sintering would typically destroy corresponding wire bond connections.

If smaller assemblies are used, however, it can be relatively complex to provide joint cooling for all semiconductor switches. For example, in the case of the cooling of electrical components disclosed in the document US 2003/0053298 A1, the base plates supporting the components are welded to a component which forms the cooling ducts. Because of the high temperatures occurring during a welding procedure, the welding points are supposed to be relatively far away from sensitive semiconductor components, however, so that the resulting structure can have an unnecessarily large construction under certain circumstances and/or a relatively complex construction is required. Moreover, it is relatively complex to ensure that welded bonds are fluid-tight on the entire length thereof.

SUMMARY

The invention is thus based on the object of specifying a structure of a semiconductor component, which can comprise multiple semiconductor modules, improved in relation thereto, wherein in particular a good cooling capability is to be achieved for the semiconductor component.

The object is achieved according to the invention by a semiconductor component of the type mentioned at the outset, wherein the support frame comprises a respective passage, on the edge of which a base plate of the semiconductor module rests, wherein the base plate is soldered to the support frame.

In relation to welding of components, substantially lower temperatures can be used in the case of a soldered bond, even in the case of brazing, by a solder having suitable melting point being selected. Moreover, in the semiconductor component according to the invention, the base plate and the support frame preferably rest flatly on one another in a soldered region, so that the liquefied solder is drawn into the intermediate space by the capillary effect acting between the two plate-shaped regions resting on one another. In this way, a robust fluid-tightness is achieved using simple means. As will be explained in greater detail hereafter, this can be used to seal off a fluid duct for guiding, for example, liquid coolant through the base plate and the support frame jointly. In this way, very good cooling of the individual semiconductor modules can be achieved. In other words, it is proposed that the base plate and the support frame be connected in a materially-bonded manner by a solder arranged in between. The soldering can in particular be performed by laser soldering or laser brazing, respectively. The base plate in particular supports a substrate, which in turn supports the semiconductor components, for example, semiconductor chips.

The semiconductor modules in particular rest on the circumference on all sides with the edge thereof on the edge of the passage. The passage can thus be completely closed by the respective base plate by soldering on all sides, which, as explained above, can be used in particular to form a cooling duct. The base plate can in particular be soldered to the support frame in a section of the region in which it rests on the edge of the recess. An overlapping bond is thus used.

A section of the base plate, in which the base plate is soldered to the support frame, can extend completely around a region of the base plate in which the base plate comprises projections, which extend through the respective passage of the support frame, and/or it can extend completely around the respective passage of the support frame. The projections of the base plate can be in particular cooling fins, which are preferably continuously in contact with coolant fluid during operation of the semiconductor component. For example, these cooling fins or projections can protrude into a cooling duct, which guides the coolant fluid, for example, a coolant liquid. It can be ensured by the enclosure of the region in which the cooling fins are arranged and/or the complete passage that the passage is completely sealed off jointly by the base plate and the soldered bond.

A fluid duct, which is closed fluid-tight on all sides except for a coolant fluid inlet and a coolant fluid outlet, can be formed by the support frame, the respective base plate of the at least one semiconductor module, and a closure element. For example, the fluid duct can be fluid-tight with respect to a specific coolant fluid, for example, water or oil. The closure element can thus form a type of cover for the cooling duct, wherein the closure element can in particular form the coolant fluid inlet and the coolant fluid outlet and can be connected on all sides in an edge region to an edge region of the support frame or the like.

The closure element can be soldered or welded to the support frame. As explained above, a fluid-tight bond can be produced particularly simply and at relatively low temperatures by soldering. Since the connecting point is typically farther away from the semiconductor component parts of the semiconductor component and/or the semiconductor modules than the connecting point of the support frame to the base plate, however, higher temperatures can also be used and welding can be performed.

The base plate can be soldered to the support frame using a solder having a melting point of at least 450° C. In other words, the base plate and the support frame can be bonded by brazing. A particularly robust bond can be achieved in this way, wherein nonetheless lower temperatures are required for the bonding than during a welding procedure and moreover, as explained above, fluid-tightness can be achieved more easily. The solder can in particular have a melting point which is less than the melting point of the materials of the base plate and the support frame. In principle, the soldering procedure can thus be carried out without the material of the base plate and/or the support frame being melted. As explained in greater detail hereafter, however, it is also possible that these materials melt at least locally.

Semiconductor component parts of the respective semiconductor module can be attached by sintering to the base plate or a substrate attached to the base plate and/or the semiconductor module can be potted by a potting compound. As already explained at the outset, it is advantageous if semiconductor modules produced by sintering have a relatively low level of complexity. By way of the structure according to the invention of the semiconductor module, a plurality of separately constructed semiconductor modules can be assembled with little effort to form a semiconductor component which can be cooled well. Therefore, sintered semiconductor modules having relatively low complexity can be used.

Potting of the individual semiconductor modules can be performed, for example, by transfer molding, also called resin transfer molding, but also, for example, by injection molding or the like. In particular, a separate housing is not adhesively bonded to a substrate or the base plate, respectively, but rather the semiconductor module is directly potted, in particular after the sintering of the individual components or bonding of the individual components. The potting compound can terminate the semiconductor module on all sides except for exposed contact surfaces and a free lateral surface of the base plate. In this case, the contact surfaces can be contacts led to the outside in particular.

The semiconductor module can in particular comprise at least one semiconductor chip, which is arranged on a substrate or on the base plate. The side of the substrate facing away from the semiconductor chip can be bonded to the base plate. The side of the substrate facing away from the substrate and/or the semiconductor chip can comprise an edge region on the circumference, in which it rests on the support frame. In an inner region of this side of the base plate enclosed by this region, the projections and/or cooling fins can be arranged. The part resting on the support frame can completely enclose the inner region.

The support frame can consist of aluminum or an aluminum alloy. Additionally or alternatively, the base plate can consist of copper or aluminum or a composite material, in which silicon carbide particles are accommodated in an aluminum matrix. If a base plate made of copper is used, it can be nickel-plated in particular. If the above-described composite material is used as the base plate, regions in which soldering is to be performed can comprise an aluminum-rich layer to facilitate the production of a robust soldered bond. The layer thickness of this aluminum-rich layer can be, for example, 0.5 mm or more. In particular, due to the described structure of the base plate and/or the support frame, it is possible that the thermal expansion behavior of the base plate substantially corresponds to the thermal expansion behavior of a substrate applied thereon, wherein in particular good heat dissipation can be achieved.

The semiconductor module can be a half-bridge and/or the semiconductor module can be a bridge inverter or bridge rectifier, which is three-phase in particular. Bridge inverters or bridge rectifiers can be structurally identical with respect to the power component parts thereof, i.e., with respect to the semiconductor modules. They differ primarily with respect to the power transportation direction and thus with respect to the control. The semiconductor component can thus also be usable, for example, as a bridge rectifier or bridge inverter as needed.

The semiconductor component can in particular be an inverter for an electrical machine of the motor vehicle, in particular for a drive motor. The semiconductor component can additionally or alternatively also be used to provide a direct current in a generator mode of the electrical machine, for example, to power a vehicle electrical system and/or to charge a battery of the motor vehicle.

Moreover, the invention relates to a method for producing a semiconductor component, in particular a semiconductor component according to the invention, which comprises the following steps:

providing at least one semiconductor module and a support frame, which comprises a respective passage for each of the semiconductor modules, arranging the at least one semiconductor module on the support frame in such a way that a base plate of the respective semiconductor module rests on the edge of the respective passage, soldering the respective base plate to the support frame.

In the scope of the production of the semiconductor component, at least one semiconductor module is or preferably multiple semiconductor modules are attached to the support frame in that they are firstly placed in the region of the passages and subsequently the base plate thereof is soldered to the support frame in the edge region of the passage. Details in this regard were already explained above with reference to the semiconductor component according to the invention. Features explained with reference thereto can be transferred with the advantages mentioned there to the method according to the invention.

The base plate is preferably soldered to the support frame by laser soldering, in particular by laser brazing. The procedure of laser soldering or laser brazing is known in principle in the prior art and is used, for example, in body construction in motor vehicles. The workpiece is locally heated by irradiation of high-energy laser light for this purpose at a point at which the soldering procedure is supposed to take place. Narrow solder seams can also be effectuated with high accuracy by laser soldering.

To produce the semiconductor component according to the invention, the laser can be radiated in particular onto the side of the support frame facing away from the base plate. In this way, the support frame is locally heated and the solder is melted by the heated support frame. This can be particularly advantageous since excessively strong heating of component parts of the semiconductor module can be prevented in this way.

If, as explained above, a closure element is bonded to the support frame, for example, to form a cooling chamber, this can also be performed by laser soldering or laser brazing, respectively.

The semiconductor component according to the invention can also be produced according to the method according to the invention and/or as explained for the method according to the invention. In particular, the bond of the base plate to the support frame and/or of the support frame to the closure element in the semiconductor component according to the invention can be produced by laser soldering, in particular by laser brazing.

During the production according to the invention of a semiconductor component, in the scope of the soldering of the respective base plate to the support frame, the material of the base plate and/or the support frame can be locally melted. In particular, the material of the support frame can be melted on a side facing away from the base plate. However, it is also possible that the support frame is melted over its entire thickness and/or the side of the base plate facing toward the support frame is melted. Nonetheless, in relation to a direct material bond of support frame and base plate by welding, in the case of the soldering according to the invention, because of the capillary effect between base plate and support frame, solder is nonetheless drawn between them and therefore a fluid-tight bond is created particularly robustly.

BRIEF DESCRIPTION OF THE DRAWINGS

Further advantages and details of the invention result from the following exemplary embodiments and the associated drawings. In the schematic figures.

DETAILED DESCRIPTION

Figure 1:
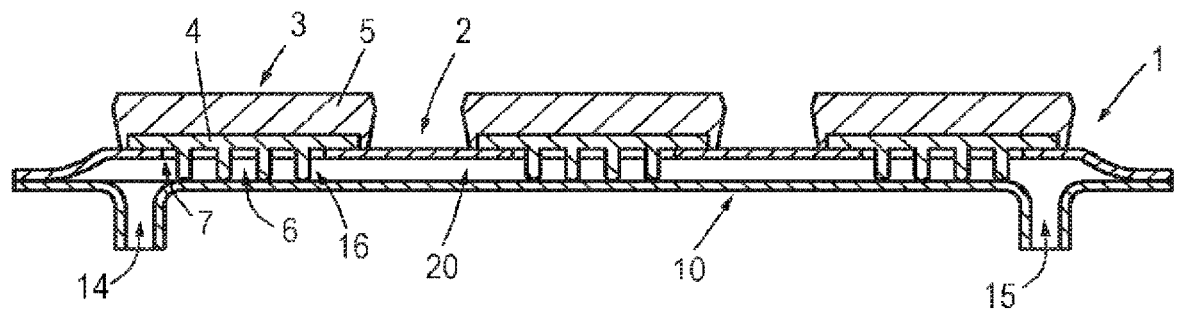
FIG. 1 shows an exemplary embodiment of a semiconductor component according to the invention.

FIG. 1 shows a semiconductor component 1, which can be, for example, a three-phase bridge rectifier or bridge inverter. Since the individual semiconductor component parts (not shown) are supposed to be bonded to a substrate by sintering, it can be advantageous not to embody such a rectifier or inverter, respectively, as a single module, but rather to use, for example, three semiconductor modules 3, which can each implement a half-bridge, for example. The internal structure of the individual semiconductor modules 3 and the contacting thereof are not shown in the figures for reasons of clarity. The production of, for example, half-bridges as sintered semiconductor components is known in principle in the prior art and is therefore not to be explained here.

To nonetheless enable a good ability to handle the semiconductor component 1 constructed in the example from three semiconductor modules 3 and in particular to enable joint cooling of the semiconductor modules 3, the semiconductor modules 3 are arranged on a common support frame 2. The support frame 2 can be formed, for example, from a sheet-metal component or the like, which comprises multiple passages 6. The semiconductor modules 3 each comprise a base plate 4, which supports the further components, i.e., the semiconductor component parts directly or a substrate supporting the semiconductor component parts, respectively, and are potted by a potting compound 5. The base plate 4 extends through each of the passages 6 with projections 16, in particular cooling ribs, and rests on the edge 7 of the respective passage 6.

As will be explained in greater detail hereafter, a fluid duct 20 is provided on the side of the support frame 2 facing away from the semiconductor modules 3, through which, for example, liquid coolant can be conducted. To seal off the fluid duct 20, the base plate 4 is to be bonded fluid-tight to the support frame 2. This is performed in the semiconductor component 1 in that the respective base plate 4 is soldered to the edge 7 of the respective passage 6 of the support frame 2. This will be explained in greater detail hereafter with reference to FIGS. 2 and 3.

Figure 2:
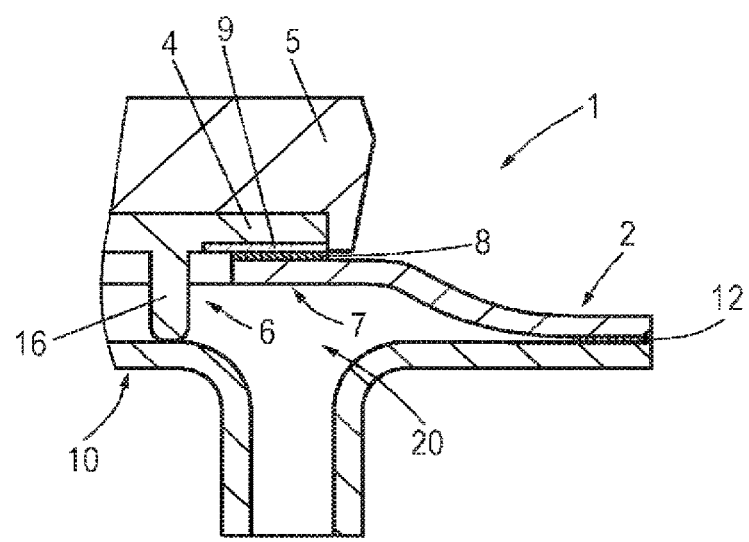
FIG. 2 shows a detail view of the semiconductor component shown in FIG. 1.

FIG. 2 shows an enlarged detail view of the semiconductor component 1. As can be seen therein, a solder 8 is arranged between the base plate 4 and the support frame 2 in the region of the edge 7, the melting temperature of which is lower than the melting temperature of the material of the base plate 4 and the support frame 2. To be able to ensure a robust bond even in the case of the relatively high operating temperatures sometimes occurring in semiconductor switches, a solder 8 having a melting point of at least 450° is preferably used, i.e., brazing is performed. Corresponding solders are known in the prior art and are not to be explained in greater detail.

Figure 3:
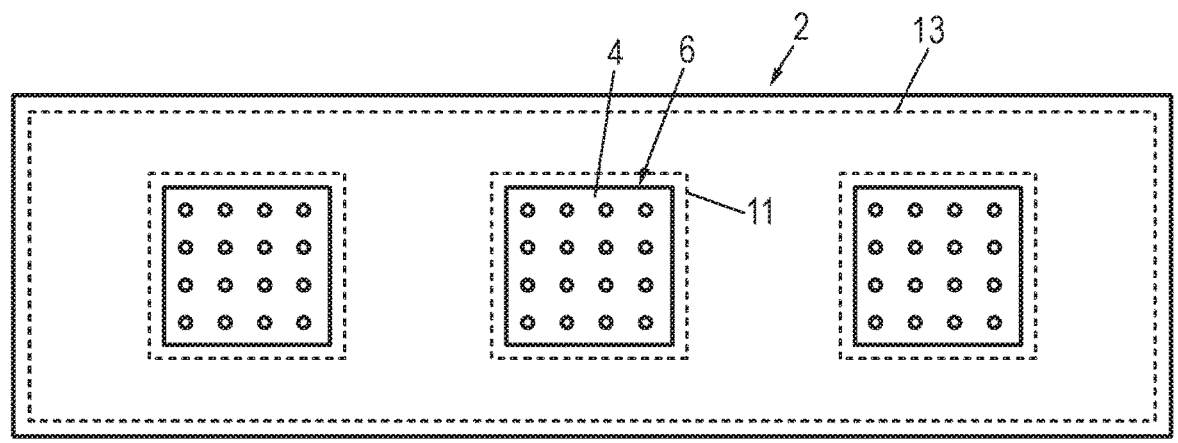
FIG. 3 shows an intermediate step in an exemplary embodiment of the method according to the invention for producing the semiconductor component shown in FIG. 1 and FIG. 2.

FIG. 3 shows an intermediate step in the scope of the production of the semiconductor component 1, wherein in this state the closure element 10 is not yet attached to the semiconductor component 1 and wherein FIG. 3 shows a view of the side of the support frame 2 facing away from the semiconductor modules 3. The dashed lines 11 each show the section of the base plate 4 in which the respective base plate 4 is soldered to the support frame 2. As can be seen clearly in FIG. 3, the solder seam or the section in which soldering is performed completely encloses the passage 6 and/or the region in which projections 16 of the base plate 4 extend through the passage 6. The passage 6 is therefore completely sealed off by the base plate 4 and the solder 8.

The dashed line 13 in FIG. 3 shows the region in which the support frame 2 is soldered to the closure element 10 in order to form the cooling duct 16. As shown in FIG. 2, the bond of the support frame 2 to the closure element 10 is thus also produced via a solder 12, in particular also by brazing. Alternatively, this bond could also be produced by welding, since it is arranged relatively far away from utilized semiconductor chips. Due to the attachment of the closure element 10 to the support frame 2 and the fluid-tight bonds between closure element 10 and support frame 2 and/or between support frame 2 and the base plates 4 by the respective solder 8, 12, the fluid duct 20 is closed fluid-tight except for a fluid inlet 14 and a fluid outlet 15. The projections 16 and/or cooling fins can thus have a liquid coolant flow around them, for example, in a closed fluid circuit.

The soldering of the respective base plates 4 to the support frame 2 and/or of the support frame 2 to the closure element 10 is preferably performed by laser soldering. The solder 8, 12 can be arranged on one of the component parts or can be arranged between them before the soldering procedure for this purpose. Laser light can subsequently be radiated into the corresponding region to melt the solder 8, 12 and thus solder the components.

To solder the base plates 4 to the support frame 2, the laser can be radiated in particular from the side of the support frame 2 shown in FIG. 3, i.e., from below in FIG. 1. The support frame 2 is thus locally heated in the region of the dashed lines 11 and, with the heating of the support frame, the solder 8 arranged on the other side of the support frame 2 is also melted. If the melting point of the solder is selected to be sufficiently low, it is possible to prevent the material of the base plate 4 and/or the support frame 2 from melting. However, it is also possible that the materials of support frame 2 and/or base plate 4 melt at least locally while the materials are soldered.

Figure 4:
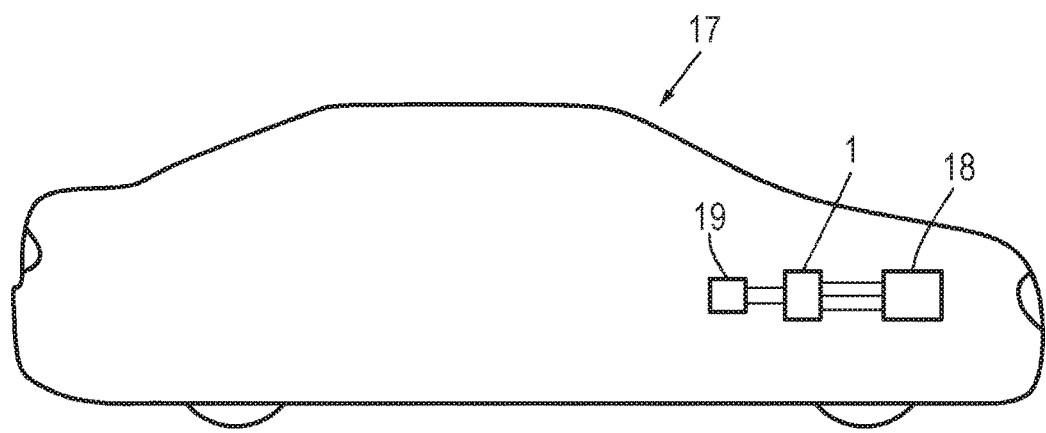
FIG. 4 shows an exemplary embodiment of a motor vehicle according to the invention.

FIG. 4 shows by way of example a vehicle 17, in which an electric machine 18, in particular a drive machine of the motor vehicle 17, is to be supplied by a battery 19 or another DC voltage source, for example, a vehicle electrical system. To convert the DC voltage of the battery 19 and/or of the vehicle electrical system into a three-phase AC voltage for operating the electric machine 18, the component 1 shown in FIGS. 1 and 2 is used as an inverter. The same component 1 could be used, for example, in a generator mode of the electric machine 18 to rectify the generated three-phase AC voltage, for example, in order to charge the battery 19.

The invention claimed is:

1. A semiconductor component comprising:
a closure element formed as a substantially flat plate;
a support frame soldered to the closure element about a perimeter of the support frame and shaped to bulge away from the closure element so as to form and enclose a cooling duct together with the closure element; and
at least one semiconductor module, each comprising a base plate from which a plurality of cooling fins extend,
wherein each of the at least one semiconductor module is provided with and arranged in a corresponding passage opening formed in the support frame such that the base plate rests on and is soldered to the support frame about a perimeter of the corresponding passage opening to form a liquid-tight seal,
wherein the cooling duct comprises a fluid duct; a coolant fluid inlet; and a coolant fluid outlet,
wherein the fluid duct is substantially orthogonal to the coolant fluid inlet and the coolant fluid outlet,
wherein each of the at least one semiconductor module is oriented within the corresponding passage opening so that the plurality of cooling fins extend into the fluid duct and contact the closure element opposite the base plate, and
wherein each of the at least one semiconductor module is individually potted with a potting compound.

2. The semiconductor component as claimed in claim 1, wherein the cooling duct is closed fluid-tight on all sides except for the coolant fluid inlet and the coolant fluid outlet.

3. The semiconductor component as claimed in claim 1, wherein the base plate is welded to the support frame using a solder having a melting point of at least 450° C.

4. The semiconductor component as claimed in claim 1, wherein the base plate comprises nickel-plated copper.

5. The semiconductor component as claimed in claim 1, wherein the at least one semiconductor module is a half-bridge.

* * * * *